United States Patent
Bergmann

(10) Patent No.: US 10,340,884 B2
(45) Date of Patent: Jul. 2, 2019

(54) ARRANGEMENT COMPRISING A DMS FILTER AND A STEEP RIGHT EDGE

(71) Applicant: SNAPTRACK, INC., San Diego, CA (US)

(72) Inventor: Andreas Bergmann, Haiming (DE)

(73) Assignee: SnapTrack, Inc., San Diego, CA (US)

( * ) Notice: Subject to any disclaimer, the term of this patent is extended or adjusted under 35 U.S.C. 154(b) by 80 days.

(21) Appl. No.: 15/531,262

(22) PCT Filed: Oct. 15, 2015

(86) PCT No.: PCT/EP2015/073903
§ 371 (c)(1),
(2) Date: May 26, 2017

(87) PCT Pub. No.: WO2016/087106
PCT Pub. Date: Jun. 9, 2016

(65) Prior Publication Data
US 2017/0331453 A1     Nov. 16, 2017

(30) Foreign Application Priority Data
Dec. 5, 2014   (DE) .................. 10 2014 118 000

(51) Int. Cl.
*H03H 9/145*     (2006.01)
*H03H 9/64*      (2006.01)
*H03H 9/00*      (2006.01)
*H03H 9/72*      (2006.01)

(52) U.S. Cl.
CPC ...... *H03H 9/14597* (2013.01); *H03H 9/0038* (2013.01); *H03H 9/14514* (2013.01);
(Continued)

(58) Field of Classification Search
CPC ............. H03H 9/145; H03H 9/64; H03H 9/72
(Continued)

(56) References Cited

U.S. PATENT DOCUMENTS 6,163,236 A  * 12/2000  Thomas ............. H03H 9/02716
                                              310/313 D
8,026,780 B2 *  9/2011  Kloska ................ H03H 9/0038
                                                    333/193

(Continued)

FOREIGN PATENT DOCUMENTS

DE        10304470 A1    8/2004
EP         1710910 A2   10/2006
(Continued)

OTHER PUBLICATIONS

Heep L.W., et al., "Selective Null Placement in SAW Coupled Resonator Filters," Proceedings of the Ultrasonics Symposium. Lake Buena Vista. Dec. 8-11, 1991, [Proceedings of the Ultrasonics Symposium]. New York, IEEE, US, vol. 1, Dec. 8, 1991 (Dec. 8, 1991). pp. 185-188. XP000347148, the whole document.

(Continued)

*Primary Examiner* — Dean O Takaoka
(74) *Attorney, Agent, or Firm* — Patterson & Sheridan, L.L.P.

(57) ABSTRACT

In an arrangement having a DMS filter, it is provided to symmetrically divide at least one of the transducers (W) of the DMS filter (DMS) into two sub-transducers (T,T') electrically connected in parallel and to shift them apart from each other by an amount of at least a half wavelength. This results in the signals of the two sub-transducers canceling each other out at a frequency in a stopband and thereby generating an attenuation pole in the upper blocking region.

13 Claims, 4 Drawing Sheets

(52) U.S. Cl.
CPC ...... *H03H 9/14588* (2013.01); *H03H 9/6436* (2013.01); *H03H 9/72* (2013.01)

(58) Field of Classification Search
USPC .................................................. 333/193, 195
See application file for complete search history.

(56) References Cited

U.S. PATENT DOCUMENTS

| | | | |
|---|---|---|---|
| 8,179,211 | B2 | 5/2012 | Bauer et al. |
| 8,823,469 | B2 * | 9/2014 | Telgmann ............ H03H 9/6433 333/193 |
| 2013/0109332 | A1 | 5/2013 | Aigner |
| 2013/0120084 | A1 * | 5/2013 | Bauer .................. H03H 9/0057 333/193 |

FOREIGN PATENT DOCUMENTS

| | | |
|---|---|---|
| JP | H09148873 A | 6/1997 |
| WO | 2007006375 A1 | 1/2007 |

OTHER PUBLICATIONS

International Search Report and Written Opinion—PCT/EP2015/073903—ISA/EPO—dated Feb. 9, 2016.
Jiuling L., et al., "Saw Antenna Duplexer for Trunking Communication," IEEE Ultrasonics Symp. 2004, pp. 1521-1524.
Kovacs G., et al., "DMS Filter with Reduced Resistive Losses," 2004 IEEE Ultrasonics Symposium, Aug. 23-27, 2004, Palais Des Congr Gbp Es, Montreal, Canada, IEEE Operations Center. Piscataway. NJ, vol. 1, Aug. 23, 2004 (Aug. 23, 2004), pp. 294-297. XP010784093, DOI: 10.1109/ULTSYM.2004.1417724 ISBN: 978-0-7803-8412-5.
Sharif M.A., et al., "Coupled Resonator Filters with Differential Input and/or Differential Output," IEEE Ultrasonics Symposium, Nov. 7-10, 1995, Seattle, WA, USA, pp. 67-70.
Wang W., et al., "High Selectivity SAW OMS Filter with In-between Shorted-Gratings," Ultrasonics Symposium (IUS), 2010 IEEE, IEEE, Oct. 11, 2010 (Oct. 11, 2010), pp. 1263-1266. XP031952715. DOI: 10.1109/ULTSYM.2010.5935578, ISBN: 978-1-4577-0382-9.

* cited by examiner

ARRANGEMENT COMPRISING A DMS FILTER AND A STEEP RIGHT EDGE

The invention relates to a filter arrangement that comprises a DMS filter and has a filter function with a steep right edge.

Bandpass filters for modern communication standards, such as LTE, must meet high requirements with respect to bandwidth and edge steepness. There exist bands having a high bandwidth and minimal distance from adjacent bands, in contrast to which the filters used for this must have a sufficiently high attenuation. This can only be achieved by steep edges.

Low-loss filters having a high bandwidth can be implemented as DMS filters. However, DMS filters have the disadvantage that the top edge of the passband drops off at only at a very flat slope and, compared to an adjacent band in the top frequency range, has only a minimal degree of selectivity. The near selection is therefore modest.

For broadband filters, high-coupling piezoelectric substrate materials must be used. However, with greater coupling one also attains an enlarged pole-zeroing distance in the case of one-gate resonators, the use of which in the case of transmission filters is indispensable. The expanded pole-zeroing interval then results, in turn, in a greater transition bandwidth and, hence, in a relatively minimal edge steepness. To some extent, this does not meet the requirements for the respective communication system.

If a capacitor is connected in parallel to the single-gate resonators and this an turn as connected to a DMS filter, the pole zeroing distance of the single-gate resonators responsible for the top edge can indeed be reduced as a result. However, also the qualities of the resonators modified in this way suffer compared to the resonators without capacitors connected in parallel. This in turn results in an expanded insertion loss, in particular at the upper edge of the pass-through region.

Different efforts were made to resolve this problem, all of which in turn exhibited new disadvantages, however, and therefore are unfeasible for either technical or economical reasons.

The object of the present invention is therefore to provide an arrangement having a DMS filter, that is, a filter arrangement that offers a clearly higher selectivity in the near upper blocking region than the known DMS filters. Another object is to set the bandwidth of such a filter sufficiently high.

This object is achieved according to the invention by an arrangement according to claim 1. Advantageous embodiments of the invention are provided an additional claims.

An arrangement having a new type of DMS filter is specified. The DMS filter has first and second transducers that are arranged in particular alternately on the piezoelectric substrate between two reflectors. The first transducers are connected to an input or output of the arrangement, the second transducers respectively to the other output and input of the arrangement.

Compared with a known DMS filter, in the DMS filter according to the invention at least one of the transducers of a type selected from a first and second transducer, but preferably all transducers of a type, are symmetrically divided into two sub-transducers electrically connected in parallel. With respect to their original position in the undivided transducer, the two sub-transducers are now spaced apart slightly less than a half wavelength $\lambda$ plus n times $\lambda$, n being an integer greater than or equal to zero (0, 1, 2, etc.). Thus, the difference D from the known arrangement can assume a value of, for example, $$D=0.5\lambda-d+n\lambda,$$

where $0<d<0.2\lambda$. The distance between the two sub-transducers, which is no longer equal to the finger distance in the original transducer, is dimensioned in such a way that the acoustic or electrical signals generated by the two sub-transducers cancel each other out at a frequency in the stopband. At this frequency, a zero is produced in the transfer function. The transducer split into two sub-transducers is still referred to below as a transducer (having two halves or two sub-transducers), regardless of whether other elements of the filter, such as reflector strips, are arranged in between.

By appropriately positioning this zero, the right edge is steepened considerably compared to a known DMS filter without causing the other filter properties to be impaired. The DMS filter is, in particular with regard to the transducers, symmetrical in design and, with regard to the arrangement of the individual transducers, has axial symmetry, the mirror axis of which runs through one of the transducers or through the middle between the two sub-transducers. As a result, the DMS filter has an uneven number of transducers. The alternating arrangement of first and second transducers along the direction of propagation of the acoustic wave in the DMS filter also allows a high symmetry of the individual signal components to be achieved with which an exact transfer function can be ensured.

The DMS filter can be electrically connected single-ended on both sides. However, it is also possible to operate at least one of the sides made up of an input and output with symmetrical signal processing and thus create a balanced input or output of the filter arrangement.

The improved DMS filter and thus the improved arrangement with the new DMS filter is characterized by the fact that it can be produced without additional effort and has only a slightly higher transducer length compared to the known DMS filter, which is, however, practically insignificant with respect to the total area. There is also no need for further compensation measures to operate the filter or the arrangement with the new DMS filter. Only the number of fingers in the sub-transducers is increased. The closer the transmission zero generated by the split is to the upper band edge, the greater the increase of the number of fingers in the split transducers. The total number of electrode fingers in the two sub-transducers is greater than the sum of the electrode fingers in the undivided transducer of the corresponding known filter.

According to one embodiment, the two sub-transducers are spaced apart such that the clearance between the two sub-transducers that is measured between the outer edges of the terminal electrode fingers of the sub-transducers that face each other is more than one wavelength. It can be seen that a sharper resonance is obtained with an increasing open clearance of the two sub-transducers. In turn, the upper edge of the passband is further controlled with such a clearance. Overall, the frequency of this additional resonance from the signals generated by the two sub-transducers by suitably dimensioning the clearance as placed in such a way that the resonance comes to lie near the upper edge of the passband. The antiresonance, however, comes to lie outside of, but close to the passband.

When the invention is applied to leaky wave substrates, an increasing open clearance between the two sub-transducers causes a part of the acoustic wave to dip into the substrate and no longer be available for the signal processing. To guide the acoustic wave near the surface on leaky wave substrates it is therefore advantageous to apply a metallization in the open clearance between the two sub-transducers on the substrate surface. Preferably, a metallization is applied in such a way that the metallization thickness does not change too much beyond the transducer or the two sub-transducers to avoid generating discontinuities. A suitable metallization therefore comprises a strip pattern, that is, an arrangement of parallel strips whose clearance is chosen to be similar to that of the electrode fingers in the sub-transducers.

The DMS filter is characterized by at least one transducer divided into sub-transducers. According to one embodiment, however, two or more transducers of a type selected from a first and second transducer are divided in an identical or similar manner into sub-transducers.

According to one embodiment, all transducers of a type are divided into sub-transducers. If not all transducers are divided into sub-transducers, the division is done symmetrically to avoid jeopardizing the good filter properties. This means that the divided transducers are symmetrically distributed in the filter.

In an advantageous embodiment of the invention, the filter is designed symmetrically again for asymmetrical operation and has an uneven total number of first and second transducers. Due to the symmetry and the alternating arrangement of first and second transducers, the two outer transducers in the DMS filter are formed by the transducer type of which there is a greater amount in the DMS filter. Transducers of a type are divided into sub-transducers. These can be individual transducers. Preferably, all transducers of this type are divided. It is also possible to divide all transducers, except for the two outer transducers in the DMS filter mentioned above.

Using a suitable design of the DMS filter, the signals of these two outer transducers can also be used to generate an additional attenuation pole that is associated with an additional antiresonance. This is achieved according to the invention by a suitably selected distance of the respective outer transducers of this type from the adjacent reflector. Therefore, the antiresonance is formed by the interaction of the transducer signals of the outer transducer with the signals reflected by the reflector.

According to one embodiment, an arrangement according to the invention includes in addition to the DMS filter at least one series resonator connected in series to the DMS filter and a parallel resonator connected thereto in parallel.

Using the two resonators, which are advantageously connected to the input of the filter arrangement, an improved constancy of performance of the arrangement is achieved. If the resonant frequencies of the resonators are suitably selected, they can also be used to form the passband and to further sharpen or steepen the upper passband edge.

The arrangement can comprise further resonators that are connected in series or parallel to the DMS filter. The further resonators can form one or more base-elements of a ladder-type structure, that is, constitute a reactance filter themselves.

In one embodiment, the filter arrangement comprises one coil that is connected in series with the input and output of the arrangement. An impedance transformation is effected with these connection coils. For this purpose, coils can also be connected in parallel to the filter input or output.

According to one embodiment, a capacitor is connected in parallel to a resonator to reduce its pole-zero clearance. In this way, it is possible to produce a sharper resonance, which also allows the upper edge to be steepened. Preferably, capacitors are connected at least in parallel to the serial resonators.

However, it is also possible to connect capacitors in parallel to all resonators that are connected to the arrangement.

Furthermore, it is advantageous if the pole-zero clearances are selected differently for the resonators used in the arrangement. This can be done by using at least one bandwidth means in each of the resonators that can be used to change the pole-zero clearance and thus design it in a variety of ways for different resonators.

For example, the values of the capacitors connected in parallel to the resonators can be selected differently as a bandwidth means. It is also possible to set the height of a compensation layer, which is applied to the filter to reduce the temperature coefficients of the frequency, differently. It is particularly easy to vary the height of a $SiO_2$ layer covering the filter arrangement.

The parallel resonators of the arrangement are each arranged in parallel branches that connect a serial signal line to a ground connection. The parallel branches can be connected to the ground connection via a serial inductor. It is possible to connect each parallel branch having a separate serial inductor to the ground connection. Alternatively, multiple parallel branches can be combined on the ground side and connected to the ground connection via a shared serial inductor.

In a further embodiment, the metallization that separates the sub-transducers is designed as an electrically floating or short-circuited strip pattern. This strip pattern serves to shape the course of the metallization thickness over the length of the transducer while keeping discontinuity to a minimum. For this purpose, it is advantageous to change and, in particular, reduce finger distances, finger widths and the pitch measured from finger center to finger center in the region of the transition from a transducer to the adjacent transducer or from a transducer to the reflector or from a transducer to the metallization in the form of a strip pattern. Up to n terminal electrode fingers are varied in terms of width and/or distance to make the changes of these parameters as small as possible from finger to finger. Preferably, the number n of electrode fingers, reflector strips or strips of the strip pattern changed in this regard are selected to be between 3 and 12. n preferably increases as the clearance of the terminal fingers without this variation differs more greatly from a multiple of $\lambda/2$.

The invention will be explained in greater detail below with reference to exemplary embodiments and the accompanying figures. The figures are only schematic and not true to scale. The structures are shown in simplified form and the figures show neither relative nor absolute indications of size. Identical parts or parts that function in the same manner have the same reference numbers in the figures.

BRIEF DESCRIPTION OF THE DRAWINGS

FIG. 1 shows a schematic illustration of a known DMS filter having three transducers. The filter includes between a first reflector R1 and a second reflector R2 two first transducers W11, W12, between which a second transducer W20 is arranged. The first transducers are connected in parallel and are connected, for example, to the filter input. Second transducer W20 is connected, for example, to the filter output. However, it is also possible to switch the respective input and output assignments of the DMS filter.

FIG. 2 shows a first simple design of a DMS filter according to the invention originally having three transducers. In contrast to the known three-transducer DMS according to FIG. 1, the transducer, in this case the second transducer, is of a type that is divided into two sub-transducers T20, T20' that are electrically connected in parallel in the example to the output of the filter. First transducers W11, W12 flank the two sub-transducers in a conventional manner. Because of the division into sub-transducers, the total number of electrode fingers for the entire unit of first and second transducers T20, T20' is increased compared to the undivided transducers of the known DMS structure. The clearance between first and second transducers T20, T20' is selected to be greater than a finger-finger clearance in the transducer and also greater than the clearances between the transducers of known DMS filters.

FIG. 3 shows a similar DMS filter according to the invention having the same number of transducers and sub-transducers, in which the distance D between the two sub-transducers T20, T20' is further increased. Distance D can be several times the distance between a sub-transducer and the directly adjacent "conventional" transducer.

FIG. 4 shows a further DMS filter according to the invention originally having three transducers and a center transducer divided into sub-transducers T20, T20', in which a metallization M is inserted between the two sub-transducers T20, T20' in the form of a metallic strip pattern. The strip pattern is designed like a conventional reflector, but preferably has a smaller number of reflector strips to guarantee acoustic permeability to a large extent, however, the proper functioning of the DMS filter according to the invention does not depend on the degree of permeability of the strip pattern of the metallization M, as long as there is any permeability at all.

FIG. 5 shows a DMS filter according to the invention originally having three transducers as shown in FIG. 1, in which the two first transducers that are connected to the connections arranged above in the figure are divided into sub-transducers T11, T11' or T12, T12'. The center transducer, which is a second transducer W20, remains undivided. A metallization M11, M12, which is in turn designed as an electrically short-circuited strip pattern, is inserted between the sub-transducers of each of the divided first transducers.

The two sub-transducers of a divided transducer are each electrically connected in parallel. As in the conventional DMS filter, the two divided first transducers can also be electrically connected in parallel such that a single-ended connection results from a total of four sub-transducers T11, T11', T12, T12' connected in parallel. However, it is also possible to connect the two divided first transducers to a symmetrical filter connection.

Figure 6:
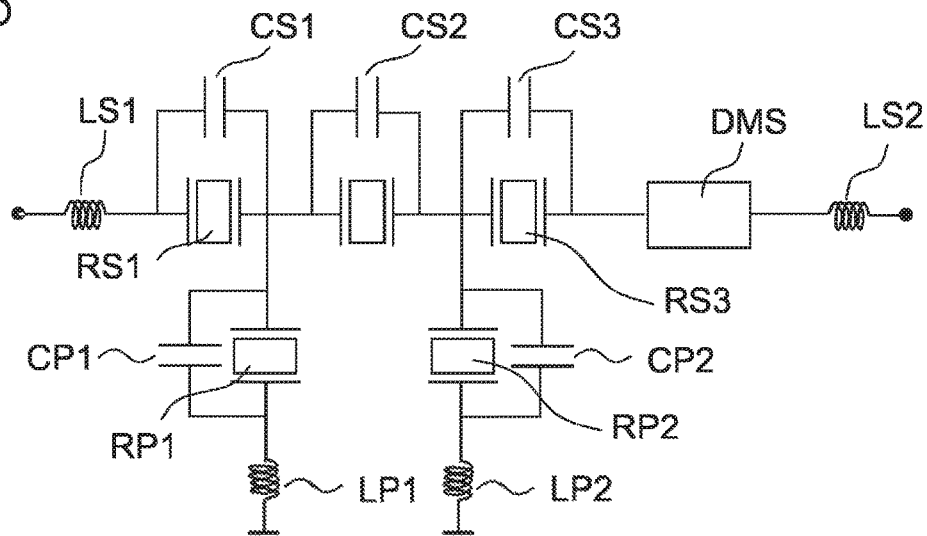
FIG. 6 shows an arrangement having a DMS filter that comprises a connection of resonators, capacitors and inductors.

FIG. 6 shows an arrangement in which the DMS filter according to the invention can be connected to further circuit components, in particular with resonators to make an extended filter arrangement. DMS filter DMS is only shown schematically and can have different designs with any number of divided and undivided transducers. However, filter arrangements according to the invention comprise DMS filters DMS according to the invention in which at least one of the transducers is divided into sub-transducers. In a circuit configuration with DMS filter DMS, three serial resonators RS1, RS2 and RS3 are connected between the input and output of the arrangement. Two parallel arms are connected in parallel to this circuit configuration to ground, in which a parallel resonator RP1, RP2 is arranged in each case.

At least the serial resonators RS are each connected in parallel to a capacitor CS. In the exemplary embodiment shown, the parallel resonators RP are also connected in parallel to a capacitor CP.

On the input and output side, the circuit configuration or arrangement is connected to a serial coil LS1, LS2, it being possible to arrange serial coil LS1, for example, on the input side and serial coil LS2 on the output side. However, the input and output of the arrangement can also be switched.

The parallel branches are each connected to the ground via a serial inductor LP1, LP2. However, it is also possible to connected both parallel branches in parallel to a shared serial inductor and only then connect them to the ground connection.

Figure 1:
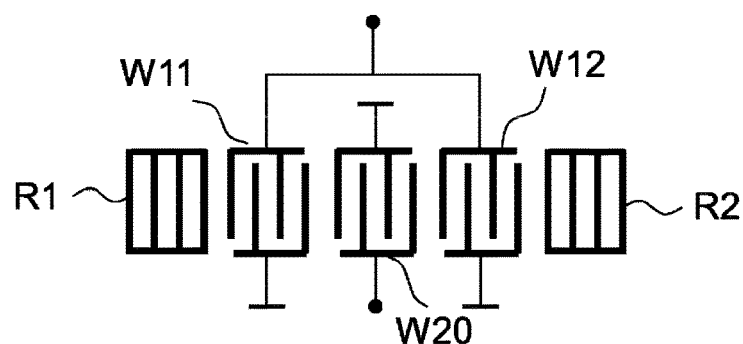
FIG. 1 shows a known DMS filter having three transducers.
Figure 2:
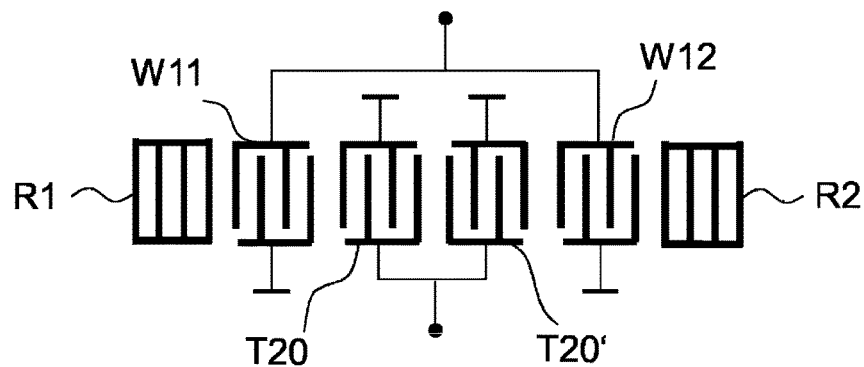
FIG. 2 shows a DMS filter according to the invention having a divided center transducer.
Figure 3:
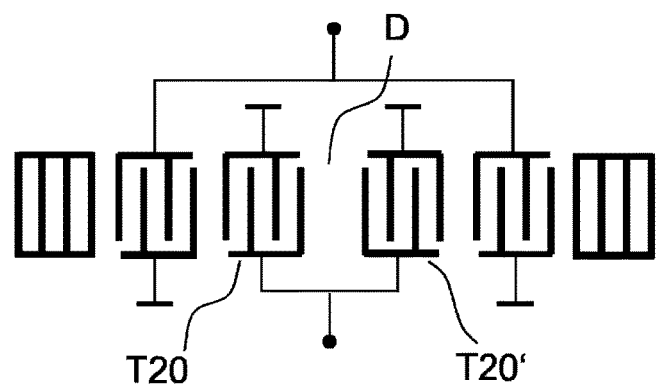
FIG. 3 shows a DMS filter according to the invention, wherein the clearance between the sub-transducers is increased.
Figure 4:
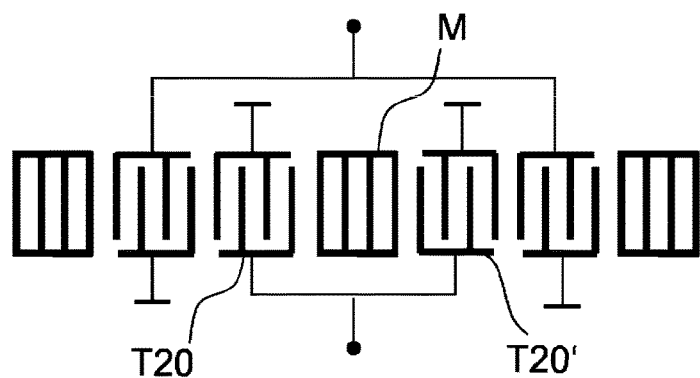
FIG. 4 shows a DMS filter according to the invention, wherein the clearance between the sub-transducers is filled by a strip pattern.
Figure 5:
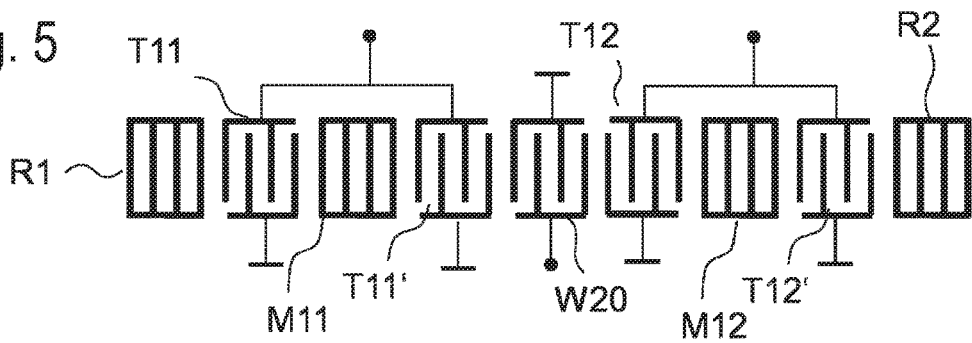
FIG. 5 shows a DMS filter according to the invention, wherein two transducers are divided into sub-transducers separated by a metallic strip pattern.

The filter arrangement shown in FIG. 6 will now be realized using a DMS filter as shown in FIG. 5 and, for comparison, compared with a corresponding arrangement having a known DMS structure as shown in FIG. 1.

Figure 7:
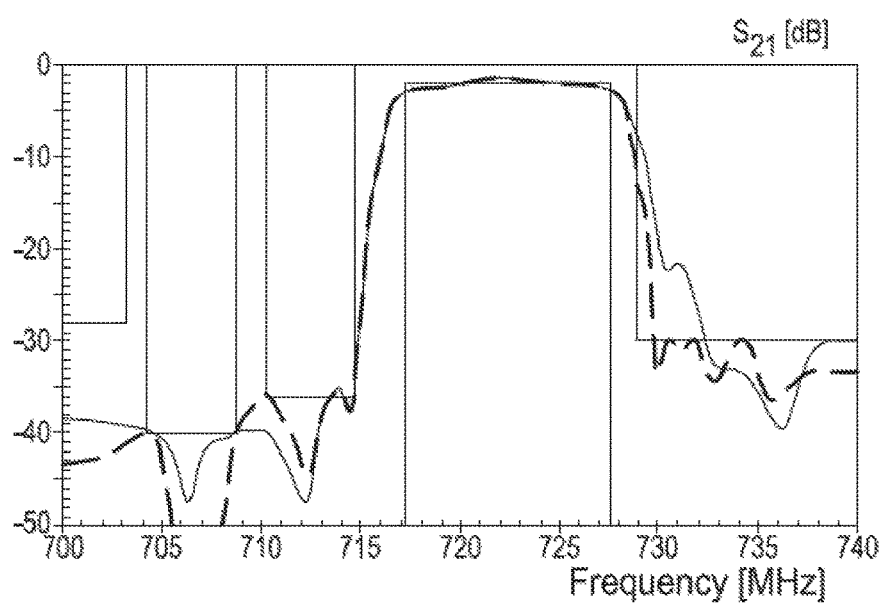
FIG. 7 shows the passage performance of a filter arrangement according to the invention compared to the passage performance of a known filter arrangement having a conventional DMS filter.

FIG. 7 shows the transfer function S21 of the two arrangements, curve K1 corresponding to an arrangement according to the invention, but curve K2 corresponding to the arrangement having the known DMS filter from FIG. 1. Curve K1 of the arrangement according to the invention shows the strongest advantages in the region of the upper passband edge, which drops more steeply here than curve K2 of the arrangement having the known DMS filter. Moreover, the damping in the near blocking region is improved. In the region of the passband, both arrangements show almost the same behavior, such that curves K1 and K2 are virtually coincident there.

Figure 8:
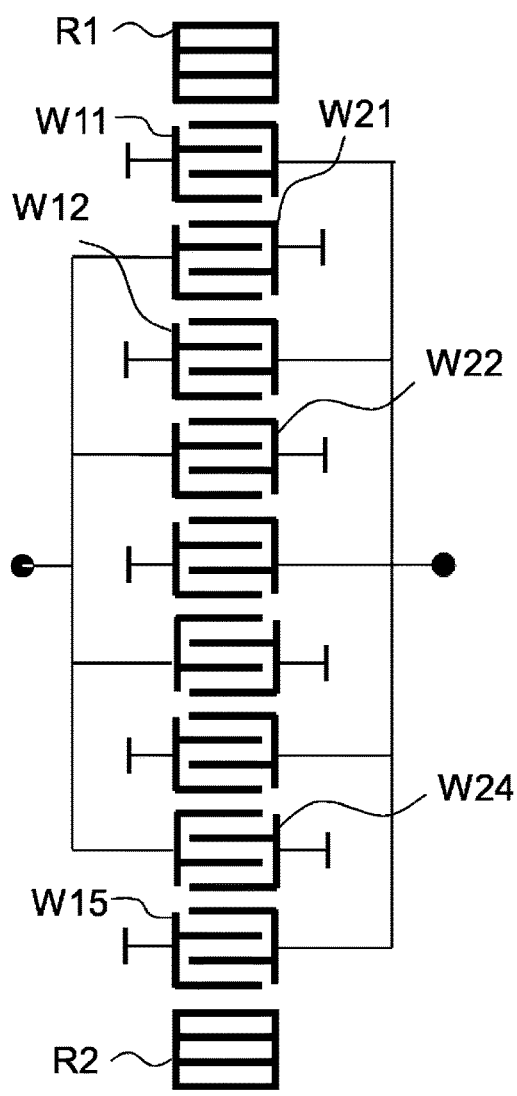
FIG. 8 shows a known DMS filter having nine transducers.

FIG. 8 shows a known DMS filter having nine transducers, in which five first transducers W11 to W15 are arranged in an alternating manner with four second transducers W21 to W24 between two reflectors R1, R2. All first transducers can be connected in parallel to a connection of the filter, while the four second transducers can also be connected in parallel to a second connection of the filter.

Figure 9:
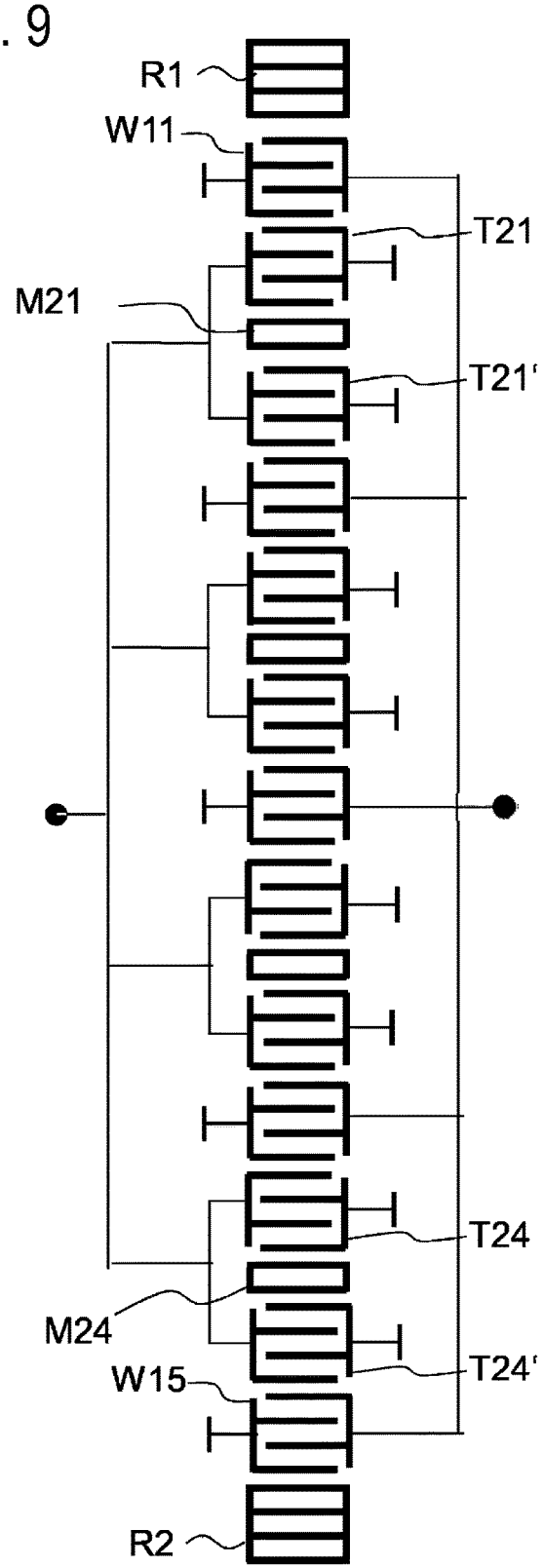
FIG. 9 shows a DMS filter according to the invention originally having nine transducers, of which four are divided into sub-transducers.
Figure 10:
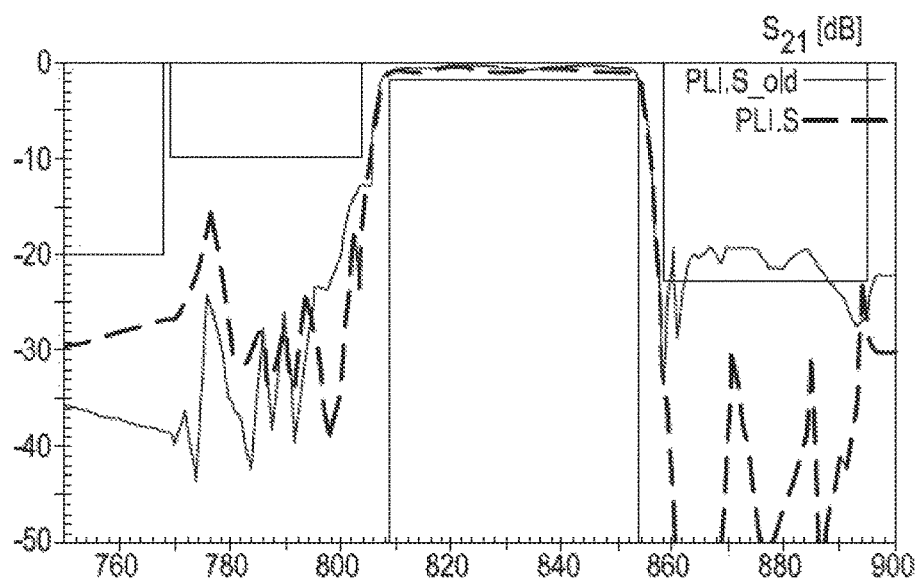
FIG. 10 shows the passage performance of the DMS filter according to the invention shown in FIG. 9 in comparison with the passage performance of the known DMS filter shown in FIG. 8.

FIG. 9 shows an embodiment according to the invention of such a nine-transducer DMS filter. For this purpose, all second transducers (W21 to W24 from FIG. 8) are divided into sub-transducers T21 to T24, a metallization M2 being arranged between two sub-transducers T2 that can be designed as a strip pattern. All sub-transducers T21 to T24 can be connected in parallel to a filter connection. The same applies to all first transducers W11 to T15. The DMS filter according to the invention shown in FIG. 9 can also be connected in an arrangement, as shown, for example, in FIG. 6. FIG. 10 shows the transfer function of such an arrangement in comparison with the one of an arrangement in which switching elements as shown in FIG. 6 are connected to a DMS filter as shown in FIG. 8. Curve K1 shows the filter arrangement having the DMS filter as shown in FIG. 9, whereas curve K2 shows the filter arrangement having the known DMS filter according to FIG. 8.

In this case, the improvement is predominantly shown in the region above the passband and in the near blocking region. The selection in the near blocking region is significantly improved. However, with respect to the steepness of the right edge of the passband, both curves K1, K2 only show insignificant differences because correspondingly steep edges can already be achieved due to the high number of transducers in the DMS filter in conjunction with the connected resonators.

The antiresonance formed between two sub-transducers is applied to a frequency that produces an additional damping pole in the near blocking region, which leads to a better damping level in this region.

It is evident that greatly improved filter arrangements can be obtained with the new DMS filters. These filter arrangements make the use of these filters possible in modern communication standards, such as LTE. The new filter arrangements can satisfactorily meet the requirements set for bandwidth and edge steepness.

Although the invention is particularly advantageous for broadband filters and filter arrangements, it can also be advantageous for narrowband filters. Narrow passbands must also be insulated against adjacent bands with a small band clearance. The narrowband filter must also make a corresponding selection possible. This is also possible with the arrangements according to the invention.

Figure 11:
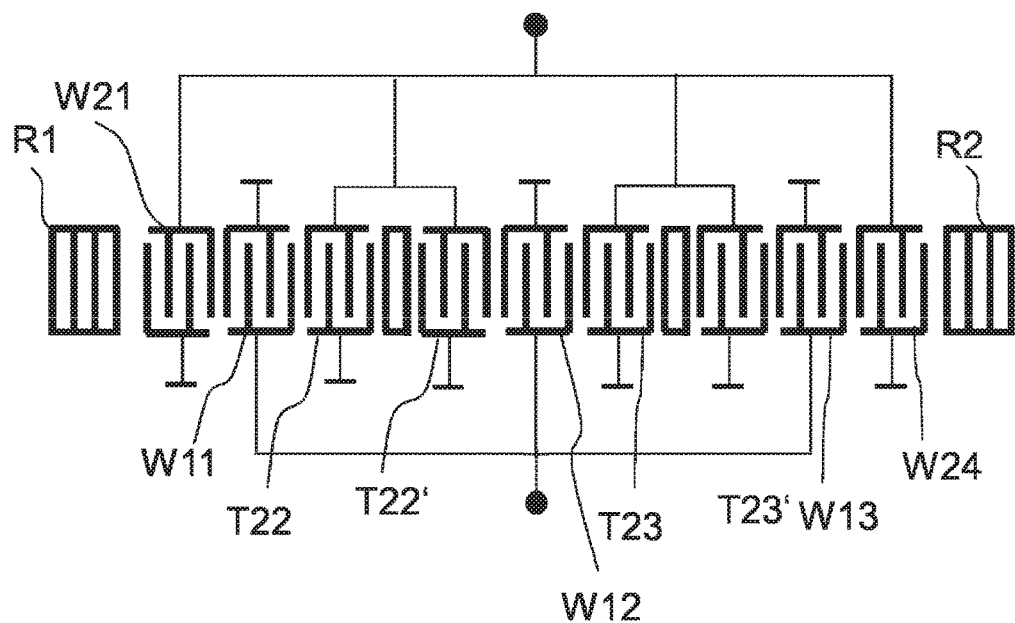
FIG. 11 shows a DMS filter according to the invention originally having seven transducers, of which two are divided into sub-transducers.

FIG. 11 shows a further variant of a DMS filter of the filter arrangement according to the invention. On the basis of a known DMS filter having seven transducers, only the two center second transducers W22, W23 out of the original four second transducers W21 to W24 are divided into sub-transducers T22, T22' and T23, T23', respectively. The two outer second transducers W21 and W24 remain undivided. A partially transparent reflector can be arranged between two sub-transducers resulting from the splitting of a transducer, as is also shown in the figure.

To also generate additional antiresonances with these two outer second transducers W21, W24 that cause the signal to be canceled out at a frequency in the near blocking region, the distance of outer second transducers W21, W24 from adjacent reflector R1 or R2 is such that the desired effect of signal cancellation takes place for frequencies in the near blocking region. The phase-corrected signal superposition that causes the cancellation then occurs between the signals that are generated by the transducer, the signals that are traveling away from the reflector, and the signals that are emitted from the same transducer towards the reflector but are once again reflected by it. Thus, the desired effect can also be carried out in the arrangement, shown with fewer electrode fingers per DMS track or can be achieved with fewer divided transducers. A filter having a steeper upper passband edge and an improved upper blocking region is also obtained with this arrangement.

Of course, it is also possible to divide the two outer first transducers W21 and W24.

Because it was only possible to depict the invention using a few exemplary embodiments, it is not limited to the embodiments shown. Filter arrangements according to the invention can contain DMS filters of any design, provided that only one of the transducers is divided in the manner according to the invention and has desired additional antiresonance that is used to cancel out signals at frequencies in the near blocking region.

The number of resonators in the arrangement connected to such a DMS filter is not essential to the invention, nor is its arrangement in the circuit configuration. It may be advantageous, for example, to initially provide a parallel resonator near the filter input and not a serial resonator, as shown in FIG. 6.

Filter arrangements according to the invention can be designed on different piezoelectric substrates, but preferably on highly coupling substrates such as, for example, lithium niobate or lithium tantalite. Narrowband filters according to the invention can also be designed on more weakly coupling substrates because the advantages of the invention can be achieved regardless of the coupling strength of the substrate.

LIST OF REFERENCE SIGNS

R1, R2 reflectors
W1 first transducers
W2 second transducers
T, T' sub-transducers
D open space between sub-transducers
M metallization between sub-transducers
LS serial coil
LP parallel coil
RS serial resonator
RP parallel resonator
CS serial capacitor
CP parallel capacitor
DMS DMS filter
LP serial inductor

The invention claimed is:

1. An arrangement comprising a DMS filter,
wherein the DMS filter (DMS) has first and second converters (W1,W2) that are arranged alternately on a piezoelectric substrate between two reflectors (R1, R2) and are each connected to an input or output of the arrangement,
wherein at least one of the transducers (W1, W2) is symmetrically divided into two sub-transducers electrically connected in parallel, and
wherein the sub-transducers are shifted apart from each other by an amount of approximately one half wavelength with respect to their original position in such a way that their signals cancel each other out at a frequency in a stopband.

2. The arrangement according to claim 1, wherein the open clearance between the two sub-transducers that is measured from the outer edges of terminal electrode fingers of the sub-transducers that face each other is more than one wavelength.

3. The arrangement according to claim 2, wherein an acoustically non-excitatory metallization is arranged on the substrate in the open clearance between the two sub-transducers.

4. The arrangement according to one of the claims 1-3, wherein the two or more transducers of a type selected from a first and second transducer are available and wherein the two or more of these transducers of this type are divided in an identical or similar manner into sub-transducers.

5. The arrangement according to claim 4, wherein the DMS filter has a symmetric structure and an uneven total number of first and second transducers, wherein the divided transducer(s) is/are of the type to which also the outer transducers in the DMS filter are assigned, wherein, except for the two outer transducers, all transducers of this type are divided into sub-transducers.

6. The arrangement according to one of the claims 1-3, further comprising at least one series resonator connected in series to the DMS filter and a parallel resonator thereto connected in parallel.

7. The arrangement according to claim 6, wherein one coil is connected in series at the input and one at the output of the arrangement.

8. The arrangement according to claim 6, wherein a capacitor is connected in parallel to each of the serial resonators.

9. The arrangement according to claim 6, wherein the parallel resonator(s) is/are connected via a series inductor each or via a common series inductor to a ground connection.

10. The arrangement according to claim 3,
    wherein the metallization is designed as an electrically floating or short-circuited strip pattern, and
    wherein in each case up to n terminal electrode fingers, reflector fingers or strips of the strip pattern in all regions where two units, selected from among transducers, reflectors and strip patterns, are directly adjacent to each other, have a reduced spacing compared to the remaining regions of the respective transducer, reflector or strip pattern, wherein the distance is measured from the center of the respective finger or strip out, and wherein $3 \leq n \leq 12$ is selected.

11. The arrangement according to claim 4, wherein all first transducers are connected in parallel.

12. The arrangement according to claim 4, wherein all second transducers are connected in parallel.

13. The arrangement according to claim 4, wherein the transducers of at least one type selected from first and second transducer are connected to a symmetrical gate.

* * * * *